(12) United States Patent
Xiong et al.

(10) Patent No.: US 10,902,664 B2
(45) Date of Patent: Jan. 26, 2021

(54) SYSTEM AND METHOD FOR DETECTING DAMAGE USING TWO-DIMENSIONAL IMAGERY AND THREE-DIMENSIONAL MODEL

(71) Applicant: United Technologies Corporation, Farmington, CT (US)

(72) Inventors: Ziyou Xiong, Wethersfield, CT (US); Alan Matthew Finn, Hebron, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 15/970,985

(22) Filed: May 4, 2018

(65) Prior Publication Data
US 2019/0340805 A1 Nov. 7, 2019

(51) Int. Cl.
*G06T 15/04* (2011.01)
*F01D 21/00* (2006.01)
*G02B 23/24* (2006.01)
*G06F 30/17* (2020.01)

(52) U.S. Cl.
CPC ............ *G06T 15/04* (2013.01); *F01D 21/003* (2013.01); *G02B 23/2415* (2013.01); *G06F 30/17* (2020.01); *G06T 2215/16* (2013.01)

(58) Field of Classification Search
None
See application file for complete search history.

(56) References Cited

U.S. PATENT DOCUMENTS

| 3,804,397 A | 4/1974 | Neumann |
| 4,402,053 A | 8/1983 | Kelley et al. |
| 4,403,294 A | 9/1983 | Hamada et al. |
| 4,873,651 A | 10/1989 | Raviv |
| 5,064,291 A | 11/1991 | Reiser |
| 5,119,678 A | 6/1992 | Bashyam et al. |
| 5,345,514 A | 9/1994 | Mandavieh et al. |
| 5,345,515 A | 9/1994 | Nishi et al. |
| 5,351,078 A | 9/1994 | Lemelson |
| 5,963,328 A | 10/1999 | Yoshida et al. |

(Continued)

FOREIGN PATENT DOCUMENTS

| CA | 2820732 A1 | 12/2014 |
| DE | 19710743 A1 | 9/1998 |

(Continued)

OTHER PUBLICATIONS

Gao et al., 'A Statistical Method for Crack Detection from Vibrothermography Inspection Data',(2010) Statistics Preprints. Paper 68. http://lib.dr.iastate.edu/stat_las_preprints/68.

(Continued)

*Primary Examiner* — YuJang Tswei
(74) *Attorney, Agent, or Firm* — Bachman & LaPointe, PC

(57) ABSTRACT

A method for inspection of a mechanical system includes the steps of: obtaining a two-dimensional image sequence of the mechanical system; generating a three-dimensional structure model from the two-dimensional image sequence; and refining the three-dimensional structure model with an existing three-dimensional model of the mechanical system to produce a refined model having intensity and/or color information from the two-dimensional image sequence and structural accuracy of the existing three-dimensional model.

13 Claims, 5 Drawing Sheets

(56) References Cited

U.S. PATENT DOCUMENTS

| | | |
|---|---|---|
| 6,023,637 A | 2/2000 | Liu et al. |
| 6,153,889 A | 11/2000 | Jones |
| 6,177,682 B1 | 1/2001 | Bartulovic et al. |
| 6,271,520 B1 | 8/2001 | Tao et al. |
| 6,399,948 B1 | 6/2002 | Thomas |
| 6,434,267 B1 | 8/2002 | Smith |
| 6,462,813 B1 | 10/2002 | Haven et al. |
| 6,690,016 B1 | 2/2004 | Watkins et al. |
| 6,737,648 B2 | 5/2004 | Fedder et al. |
| 6,759,659 B2 | 7/2004 | Thomas et al. |
| 6,804,622 B2 | 10/2004 | Bunker et al. |
| 6,907,358 B2 | 6/2005 | Suh et al. |
| 6,965,120 B1 | 11/2005 | Beyerer et al. |
| 7,026,811 B2 | 4/2006 | Roney, Jr. et al. |
| 7,064,330 B2 | 6/2006 | Raulerson et al. |
| 7,119,338 B2 | 10/2006 | Thompson et al. |
| 7,122,801 B2 | 10/2006 | Favro et al. |
| 7,129,492 B2 | 10/2006 | Saito et al. |
| 7,164,146 B2 | 1/2007 | Weir et al. |
| 7,190,162 B2 | 3/2007 | Tenley et al. |
| 7,220,966 B2 | 5/2007 | Saito et al. |
| 7,233,867 B2 | 6/2007 | Pisupati et al. |
| 7,240,556 B2 | 7/2007 | Georgeson et al. |
| 7,272,529 B2 | 9/2007 | Hogan et al. |
| 7,313,961 B2 | 1/2008 | Tenley et al. |
| 7,415,882 B2 | 8/2008 | Fetzer et al. |
| 7,446,886 B2 | 11/2008 | Aufmuth et al. |
| 7,489,811 B2 | 2/2009 | Brummel et al. |
| 7,602,963 B2 | 10/2009 | Nightingale et al. |
| 7,689,030 B2 | 3/2010 | Suh et al. |
| 7,724,925 B2 | 5/2010 | Shepard |
| 7,738,725 B2 | 6/2010 | Raskar et al. |
| 7,823,451 B2 | 11/2010 | Sarr |
| 7,966,883 B2 | 6/2011 | Lorraine et al. |
| 8,050,491 B2 | 11/2011 | Vaidyanathan |
| 8,204,294 B2 | 6/2012 | Alloo et al. |
| 8,208,711 B2 | 6/2012 | Venkatachalam et al. |
| 8,221,825 B2 | 7/2012 | Reitz et al. |
| 8,239,424 B2 | 8/2012 | Haigh et al. |
| 8,431,917 B2 | 4/2013 | Wang et al. |
| 8,449,176 B2 | 5/2013 | Shepard |
| 8,520,931 B2 | 8/2013 | Tateno |
| 8,528,317 B2 | 9/2013 | Gerez et al. |
| 8,692,887 B2 | 4/2014 | Ringermacher et al. |
| 8,744,166 B2 | 6/2014 | Scheid et al. |
| 8,761,490 B2 | 6/2014 | Scheid et al. |
| 8,781,209 B2 | 7/2014 | Scheid et al. |
| 8,781,210 B2 | 7/2014 | Scheid et al. |
| 8,792,705 B2 | 7/2014 | Scheid et al. |
| 8,913,825 B2 | 12/2014 | Taguchi et al. |
| 8,983,794 B1 | 3/2015 | Motzer et al. |
| 9,037,381 B2 | 5/2015 | Care |
| 9,046,497 B2 | 6/2015 | Kush et al. |
| 9,066,028 B1 | 6/2015 | Koshti |
| 9,080,453 B2 | 7/2015 | Shepard et al. |
| 9,116,071 B2 | 8/2015 | Hatcher, Jr. et al. |
| 9,134,280 B2 | 9/2015 | Cataldo et al. |
| 9,146,205 B2 | 9/2015 | Renshaw et al. |
| 9,151,698 B2 | 10/2015 | Jahnke et al. |
| 9,154,743 B2 | 10/2015 | Hatcher, Jr. et al. |
| 9,240,049 B2 | 1/2016 | Ciurea et al. |
| 9,251,582 B2 | 2/2016 | Lim et al. |
| 9,300,865 B2 | 3/2016 | Wang et al. |
| 9,305,345 B2 | 4/2016 | Lim et al. |
| 9,458,735 B1 | 10/2016 | Diwinsky et al. |
| 9,465,385 B2 | 10/2016 | Kamioka et al. |
| 9,467,628 B2 | 10/2016 | Geng et al. |
| 9,471,057 B2 | 10/2016 | Scheid et al. |
| 9,476,798 B2 | 10/2016 | Pandey et al. |
| 9,476,842 B2 | 10/2016 | Drescher et al. |
| 9,483,820 B2 | 11/2016 | Lim et al. |
| 9,488,592 B1 | 11/2016 | Maresca et al. |
| 9,519,844 B1 | 12/2016 | Thompson et al. |
| 9,594,059 B1 | 3/2017 | Brady et al. |
| 9,734,568 B2 | 5/2017 | Vajaria et al. |
| 9,785,919 B2 | 10/2017 | Diwinsky et al. |
| 9,804,997 B2 | 10/2017 | Sharp et al. |
| 9,808,933 B2 | 11/2017 | Lin et al. |
| 9,981,382 B1 | 5/2018 | Strauss et al. |
| 10,438,036 B1 | 10/2019 | Reome et al. |
| 2002/0121602 A1 | 9/2002 | Thomas et al. |
| 2002/0167660 A1 | 11/2002 | Zaslavsky |
| 2003/0117395 A1 | 6/2003 | Yoon |
| 2003/0205671 A1 | 11/2003 | Thomas et al. |
| 2004/0089811 A1 | 5/2004 | Lewis et al. |
| 2004/0089812 A1 | 5/2004 | Favro et al. |
| 2004/0139805 A1 | 7/2004 | Antonelli et al. |
| 2004/0201672 A1 | 10/2004 | Varadarajan et al. |
| 2004/0240600 A1 | 12/2004 | Freyer et al. |
| 2004/0245469 A1 | 12/2004 | Favro et al. |
| 2004/0247170 A1 | 12/2004 | Furze et al. |
| 2005/0008215 A1 | 1/2005 | Shepard |
| 2005/0113060 A1 | 5/2005 | Lowery |
| 2005/0151083 A1 | 7/2005 | Favro et al. |
| 2005/0167596 A1 | 8/2005 | Rothenfusser et al. |
| 2005/0276907 A1 | 12/2005 | Harris et al. |
| 2006/0012790 A1 | 1/2006 | Furze et al. |
| 2006/0078193 A1 | 4/2006 | Brummel et al. |
| 2006/0086912 A1 | 4/2006 | Weir et al. |
| 2007/0007733 A1 | 1/2007 | Hogarth et al. |
| 2007/0017297 A1 | 1/2007 | Georgeson et al. |
| 2007/0045544 A1 | 3/2007 | Favro et al. |
| 2008/0022775 A1 | 1/2008 | Sathish et al. |
| 2008/0053234 A1 | 3/2008 | Staroselsky et al. |
| 2008/0075484 A1 | 3/2008 | Komiya |
| 2008/0111074 A1 | 5/2008 | Weir et al. |
| 2008/0183402 A1 | 7/2008 | Malkin et al. |
| 2008/0229834 A1 | 9/2008 | Bossi et al. |
| 2008/0247635 A1 | 10/2008 | Davis et al. |
| 2008/0247636 A1 | 10/2008 | Davis et al. |
| 2009/0000382 A1 | 1/2009 | Sathish et al. |
| 2009/0010507 A1* | 1/2009 | Geng ............... G06T 7/593 382/128 |
| 2009/0066939 A1 | 3/2009 | Venkatachalam et al. |
| 2009/0128643 A1 | 5/2009 | Kondo et al. |
| 2009/0252987 A1 | 10/2009 | Greene, Jr. |
| 2009/0279772 A1 | 11/2009 | Sun et al. |
| 2009/0312956 A1 | 12/2009 | Zombo et al. |
| 2010/0124369 A1 | 5/2010 | Wu et al. |
| 2010/0212430 A1 | 8/2010 | Murai et al. |
| 2010/0220910 A1 | 9/2010 | Kaucic et al. |
| 2011/0062339 A1 | 3/2011 | Ruhge et al. |
| 2011/0083705 A1 | 4/2011 | Stone et al. |
| 2011/0119020 A1 | 5/2011 | Key |
| 2011/0123093 A1 | 5/2011 | Alloo et al. |
| 2011/0299752 A1 | 12/2011 | Sun |
| 2011/0302694 A1 | 12/2011 | Wang et al. |
| 2012/0154599 A1 | 6/2012 | Huang |
| 2012/0188380 A1 | 7/2012 | Drescher et al. |
| 2012/0249959 A1 | 10/2012 | You et al. |
| 2012/0275667 A1 | 11/2012 | Lu |
| 2012/0293647 A1* | 11/2012 | Singh ............... F01D 17/02 348/82 |
| 2013/0028478 A1 | 1/2013 | St-Pierre et al. |
| 2013/0041614 A1 | 2/2013 | Shepard et al. |
| 2013/0070897 A1 | 3/2013 | Jacotin |
| 2013/0113914 A1 | 5/2013 | Scheid et al. |
| 2013/0113916 A1 | 5/2013 | Scheid et al. |
| 2013/0163849 A1 | 6/2013 | Jahnke et al. |
| 2013/0235897 A1 | 9/2013 | Bouteyre et al. |
| 2013/0250067 A1 | 9/2013 | Laxhuber et al. |
| 2014/0022357 A1 | 1/2014 | Yu et al. |
| 2014/0056507 A1 | 2/2014 | Doyle et al. |
| 2014/0098836 A1 | 4/2014 | Bird |
| 2014/0184786 A1 | 7/2014 | Georgeson et al. |
| 2014/0185912 A1 | 7/2014 | Lim et al. |
| 2014/0198185 A1 | 7/2014 | Haugen et al. |
| 2014/0200832 A1 | 7/2014 | Troy et al. |
| 2014/0350338 A1 | 11/2014 | Tanaka et al. |
| 2015/0041654 A1 | 2/2015 | Barychev et al. |
| 2015/0046098 A1 | 2/2015 | Jack et al. |
| 2015/0086083 A1 | 3/2015 | Chaudhry et al. |
| 2015/0128709 A1 | 5/2015 | Stewart et al. |
| 2015/0138342 A1 | 5/2015 | Brdar et al. |

(56) References Cited

U.S. PATENT DOCUMENTS

| | | |
|---|---|---|
| 2015/0185128 A1 | 7/2015 | Chang et al. |
| 2015/0233714 A1 | 8/2015 | Kim |
| 2015/0253266 A1 | 9/2015 | Lucon et al. |
| 2015/0314901 A1 | 11/2015 | Murray et al. |
| 2016/0012588 A1 | 1/2016 | Taguchi et al. |
| 2016/0043008 A1 | 2/2016 | Murray et al. |
| 2016/0109283 A1 | 4/2016 | Broussais-Colella et al. |
| 2016/0178532 A1 | 6/2016 | Lim et al. |
| 2016/0241793 A1 | 8/2016 | Ravirala et al. |
| 2016/0284098 A1 | 9/2016 | Okumura et al. |
| 2016/0314571 A1 | 10/2016 | Finn et al. |
| 2016/0328835 A1 | 11/2016 | Maresca, Jr. et al. |
| 2016/0334284 A1 | 11/2016 | Kaplun Mucharrafille et al. |
| 2017/0011503 A1 | 1/2017 | Newman |
| 2017/0023505 A1 | 1/2017 | Maione et al. |
| 2017/0052152 A1 | 2/2017 | Tat et al. |
| 2017/0085760 A1 | 3/2017 | Ernst et al. |
| 2017/0090458 A1 | 3/2017 | Lim et al. |
| 2017/0122123 A1 | 5/2017 | Kell et al. |
| 2017/0142302 A1 | 5/2017 | Shaw et al. |
| 2017/0167289 A1 | 6/2017 | Diwinsky et al. |
| 2017/0184469 A1 | 6/2017 | Chang et al. |
| 2017/0184549 A1 | 6/2017 | Reed et al. |
| 2017/0184650 A1 | 6/2017 | Chang et al. |
| 2017/0211408 A1 | 7/2017 | Ahmadian et al. |
| 2017/0219815 A1 | 8/2017 | Letter et al. |
| 2017/0221274 A1* | 8/2017 | Chen .................... G06T 15/005 |
| 2017/0234837 A1 | 8/2017 | Hall et al. |
| 2017/0241286 A1 | 8/2017 | Roberts et al. |
| 2017/0258391 A1 | 9/2017 | Finn et al. |
| 2017/0262965 A1 | 9/2017 | Xiong et al. |
| 2017/0262977 A1 | 9/2017 | Finn et al. |
| 2017/0262979 A1 | 9/2017 | Xiong et al. |
| 2017/0262985 A1 | 9/2017 | Finn et al. |
| 2017/0262986 A1 | 9/2017 | Xiong et al. |
| 2017/0270651 A1 | 9/2017 | Bailey et al. |
| 2017/0297095 A1 | 10/2017 | Zalameda et al. |
| 2017/0284971 A1 | 11/2017 | Hall |
| 2018/0002039 A1 | 1/2018 | Finn et al. |
| 2018/0005362 A1 | 1/2018 | Wang et al. |
| 2018/0013959 A1 | 1/2018 | Slavens et al. |
| 2018/0019097 A1 | 1/2018 | Harada et al. |
| 2018/0098000 A1 | 4/2018 | Park et al. |
| 2018/0111239 A1 | 4/2018 | Zak et al. |
| 2019/0299542 A1 | 10/2019 | Webb |
| 2019/0338666 A1 | 11/2019 | Finn et al. |
| 2019/0339131 A1 | 11/2019 | Finn et al. |
| 2019/0339165 A1 | 11/2019 | Finn et al. |
| 2019/0339206 A1 | 11/2019 | Xiong et al. |
| 2019/0339207 A1 | 11/2019 | Finn et al. |
| 2019/0339234 A1 | 11/2019 | Finn et al. |
| 2019/0339235 A1 | 11/2019 | Finn et al. |
| 2019/0340721 A1 | 11/2019 | Finn et al. |
| 2019/0340742 A1 | 11/2019 | Finn et al. |
| 2019/0342499 A1 | 11/2019 | Xiong et al. |

FOREIGN PATENT DOCUMENTS

| | | |
|---|---|---|
| EP | 1961919 A2 | 8/2008 |
| GB | 2545271 A | 6/2017 |
| JP | 06235700 A | 8/1994 |
| JP | 2015161247 A | 9/2015 |
| SG | 191452 A1 | 7/2013 |
| WO | 2013088709 A1 | 6/2013 |
| WO | 2016112018 A1 | 7/2016 |
| WO | 2016123508 A1 | 8/2016 |
| WO | 2016176524 A1 | 11/2016 |

OTHER PUBLICATIONS

Li1 Ming; Holland1 Stephen D.; and Meeker1 William Q.1 "Statistical Methods for Automatic Crack Detection Based on Vibrothermography Sequence-of-Images Data" (2010). Statistics Preprints. 69.

Henneke et al. 'Detection of Damage in Composite Materials by Vibrothermography', ASTM special technical publication (696), American Society for Testing and Materials, 1979, pp. 83-95.

http://www.npl.co.uk/commercial-services/sector-case-studies/thermal-imaging-reveals-the-invisible; Apr. 17, 2012.

Tian et al., 'A Statistical Framework for Improved Automatic Flaw Detection in Nondestructive Evaluation Images', Technometrics, 59, 247-261. Feb. 1, 2017.

Emmanuel J. Cand'es1,2, Xiaodong LI2, Yi Ma3,4, and John Wright4, "Robust Principal Component Analysis", (1)Department of Statistics, Stanford University, Stanford, CA; (2)Department of Mathematics, Stanford University, Stanford, CA; (3, 4) Electrical and Computer Engineering, UIUC, Urbana, IL (4) Microsoft Research Asia, Beijing, China, Dec. 17, 2009.

Sebastien Parent; "From Human to Machine: How to Be Prepared for Integration of Automated Visual Inspection"Quality Magazine, https://www.qualitymag.com/articles/91976. Jul. 2, 2014.

http://www.yxlon.com/products/x-ray-and-ct-inspection-systems/yxlon-mu56-tb, 2016.

U.S. Office action dated Jul. 23, 2018 issued in corresponding U.S. Appl. No. 15/971,254.

Blachnio et al, "Assessment of Technical Condition Demonstrated by Gas Turbine Blades by Processing of Images of Their Surfaces", Journal of KONBiN, 1(21), 2012, pp. 41-50.

Raskar et al., 'A Non-photorealistic Camera: Depth Edge Detection and Stylized Rendering using Multi-flash Imaging' ACM Transactions on Graphics, 2004 http://www.merl.com/publications/docs/TR2006-107.pdf.

Feris et al., 'Specular Reflection Reduction with Multi-Flash Imaging', 17th Brazilian Symposium on Computer Graphics and Image Processing, 2004. http://rogerioferis.com/publications/FerisSIB04.pdf.

Holland, "First Measurements from a New Broadband Vibrothermography Measurement System", AIP Conference Proceedings, 894 (2007), pp. 478-483. http://link.aip.org/link/doi/10.1063/1.2718010 \.

Gao et al., 'Detecting Cracks in Aircraft Engine Fan Blades Using Vibrothermography Nondestructive Evaluation', RESS Special Issue on Accelerated Testing, 2014, http://dx.doi.org/10.1016/j.ress.2014.05.009.

Gao et al., 'A Statistical Method for Crack Detection from Vibrothermography Inspection Data', Statistics Preprints. Paper 68. http://lib.dr.iastate.edu/stat_las_preprints/68.

Holland, 'Thermographic Signal Reconstruction for Vibrothermography', Infrared Physics & Technology 54 (2011) 503-511.

Li et al., 'Statistical Methods for Automatic Crack Detection Based on Vibrothermography Sequence-of-Images Data', Statistics Preprints. Paper 69. http://lib.dr.iastate.edu/stat_las_preprints/69.

Tian et al., 'A Statistical Framework for Improved Automatic Flaw Detection in Nondestructive Evaluation Images', Technometrics, 59, 247-261.

Henneke et al. 'Detection of Damage in Composite Materials by Vibrothermography', ASTM special technical publication (696), 1979, pp. 83-95.

http://www.npl.co.uk/commercial-services/sector-case-studies/thermal-imaging-reveals-the-invisible.

E. J. Candès, X. Li, Y. Ma, and J. Wright, "Robust Principal Component Analysis", submitted. http://www-stat.stanford.edu/~candes/papers/RobustPCA.pdf.

M. Sznaier, O. Camps, N. Ozay, T. Ding, G. Tadmor and D. Brooks, "The Role of Dynamics in Extracting Information Sparsely Encoded in High Dimensional Data Streams", in Dynamics of Information Systems, Hirsch, M.J.; Pardalos, P.M.; Murphey, R. (Eds.), pp. 1-28, Springer Verlag, 2010.

M. Fazel, H. Hindi, and S. Boyd, "A Rank Minimization Heuristic with Application to Minimum Order System Approximation", American Control Conference, Arlington, Virginia, pp. 4734-4739, Jun. 2001.

(56) References Cited

OTHER PUBLICATIONS

Meola et al., 'An Excursus on Infrared Thermography Imaging', J. Imaging 2016, 2, 36 http://www.mdpi.com/2313-433X/2/4/36/pdf.
Yu et al., 'ASIFT: An Algorithm for Fully Affine Invariant Comparison', Image Processing on Line on Feb. 24, 2011. http://www.ipol.im/pub/art/2011/my-asift/article.pdf.
Schemmel et al., 'Measurement of Direct Strain Optic Coefficient of YSZ Thermal Barrier Coatings at Ghz Frequencies', Optics Express, v.25, n. 17, Aug. 21, 2017, https://doi.org/10.1364/OE.25.019968.
Jean-Yves Bouguet, "Camera Calibration Toolbox for Matlab", http://www.vision.caltech.edu/bouguetj/calib_doc/, accessed on Nov. 10, 2017.
https://www.qualitymag.com/articles/91976-from-human-to-machine-how-to-be-prepared-for-integration-of-automated-visual-inspection.
http://www.yxlon.com/products/x-ray-and-ct-inspection-systems/yxlon-mu56-tb.
Yu et al. 'Shadow Graphs and 3D Texture Reconstruction', IJCV, vol. 62, No. 1-2, 2005, pp. 35-60.
U.S. Final Office Action dated Jan. 3, 2019 for corresponding U.S. Appl. No. 15/971,254.
U.S. Non-Final Office Action dated Mar. 5, 2019 for corresponding U.S. Appl. No. 15/971,227.
U.S. Non-Final Office Action dated May 28, 2019 for corresponding U.S. Appl. No. 15/971,214.
U.S. Non-Final Office Action dated Nov. 29, 2019 for corresponding U.S. Appl. No. 15/971,242.
U.S. Non-Final Office Action dated Nov. 26, 2019 for corresponding U.S. Appl. No. 15/971,194.
U.S. Non-Final Office Action dated Feb. 25, 2020 for corresponding U.S. Appl. No. 15/971,214.
U.S. Non-Final Office Action dated Apr. 30, 2020 issued for corresponding U.S. Appl. No. 15/970,944.
U.S. Final Office Action dated Aug. 27, 2020 issued for corresponding U.S. Appl. No. 15/970,944.
U.S. Non-Final Office Action dated May 21, 2020 issued for corresponding U.S. Appl. No. 15/971,236.
U.S. Non-Final Office Action dated Aug. 28, 2020 issued for corresponding U.S. Appl. No. 15/971,194.
U.S. Final Office Action dated Jun. 23 2020 issued for corresponding U.S. Appl. No. 15/971,205.
U.S. Final Office Action dated Jul. 28, 2020 issued for corresponding U.S. Appl. No. 15/971,214.
U.S. Final Office Action dated Mar. 12, 2020 for corresponding U.S. Appl. No. 15/971,194.
U.S. Notice of Allowance dated Oct. 19, 2020 issued for corresponding U.S. Appl. No. 15/971,270.
US office action dated Dec. 8, 2020 issued for corresponding U.S. Appl. No. 15/971,205.

\* cited by examiner

SYSTEM AND METHOD FOR DETECTING DAMAGE USING TWO-DIMENSIONAL IMAGERY AND THREE-DIMENSIONAL MODEL

BACKGROUND OF THE DISCLOSURE

The invention relates to inspection of mechanical systems for detecting damage.

It is well known that mechanical systems undergo wear and degradation during use. Where such systems are repairable, it is common to inspect them periodically or aperiodically to determine if any damage is sufficient to warrant repair either at the time of inspection or to predict the future time when repair will be needed. Most of these inspections are performed by human inspectors, possibly using inspection equipment. The inspection equipment may provide metrology, but often does not, and it may record any data for subsequent use. The saving of data for additional analysis is especially important as it enables diagnosis of degradation rates and Condition-Based Maintenance (CBM).

In the non-limiting example of turbines, and even more particularly gas turbine engines, the inspection equipment is typically a borescope. The borescope typically is able to save images or videos of internal components and structures. However, a borescope typically records an image or video from a limited area and gradually broadens or alters its field of view as it "snakes" or is otherwise positioned through a component or chamber. In order to know where the borescope is looking, the human inspector needs to look at the image/video data and use his/her knowledge of the internal structure. Such an inspection is generally illustrated in FIG. 1. Understanding location and perspective might not be easy, even for an experienced inspector.

What is needed is an efficient and effective method of automatically or semi-automatically analyzing inspection data to determine the imaged location and perspective, to detect the presence of damage, to categorize, parameterize, or otherwise measure any damage, and to archive the inspection results for future use.

It is well known in the field of multi-view geometry in computer vision that images of a planar scene, such as a large wall, or a remote scene (scene at infinity), or images captured with the camera rotating around its center of projection, can be stitched together to form a single big image of the scene. This process is called image mosaicking. However, when the scene is not planar or when the camera is not rotating around its center of projection, this process is negatively impacted by the parallax effect, causing inaccuracy in the mosaicked image.

It is also well known in the field of machine perception and robotic navigation that Structure from Motion (SFM) and Simultaneous Localization and Mapping (SLAM) techniques can estimate three-dimensional structures from two-dimensional image sequences.

A variety of processes that include use of borescope video of blades in an engine to determine damage are disclosed in U.S. Pat. Nos. 8,781,210; 8,781,209; 8,792,705; 8,744,166; and 8,761,490. These approaches generally analyze two-dimensional (2D) images for differences between the current image and a model learned from other two-dimensional images in a blade row.

The above methods operate on images/video only and if an approximate 3D model is constructed, it is subject to a "drifting" error as more images are used. This drifting occurs from the accumulation of small errors and eventually results in large location or orientation errors.

SUMMARY OF THE INVENTION

In one non-limiting embodiment, a method for inspection of a mechanical system, comprises the steps of: obtaining a two-dimensional image sequence of the mechanical system; generating a three-dimensional structure model from the two-dimensional image sequence; refining the three-dimensional structure model with an existing three-dimensional model of the mechanical system to produce a refined model having intensity and/or color information from the two-dimensional image sequence and structural accuracy of the existing three-dimensional model.

In a further non-limiting embodiment, the two-dimensional image sequence is obtained with a borescope.

In a further non-limiting embodiment, the mechanical system is a turbine.

In a further non-limiting embodiment, the mechanical system is a gas turbine engine.

In a further non-limiting embodiment, the refining step comprises matching the three-dimensional structure model with the existing three-dimensional model.

In a further non-limiting embodiment, the refining step comprises regression between the three-dimensional structure model and the existing three-dimensional model.

In a further non-limiting embodiment, the existing three-dimensional model comprises at least one of an as-designed CAD model, an as-built model, and a previous condition model.

In a further non-limiting embodiment, the method further comprises, before the refining step, mapping the two-dimensional image sequence to the existing three-dimensional model to obtain an augmented existing three-dimensional model, and wherein the refining step comprises refining the three-dimensional structure model with the augmented existing three-dimensional model.

In a further non-limiting embodiment, a system for inspection of a mechanical system, comprises: a camera positionable through the mechanical system to obtain a two-dimensional image sequence of the mechanical system; a processor system in communication with the camera to receive the two-dimensional image sequence and configured to generate a three-dimensional structure model from the two-dimensional image sequence, and configured to refine the three-dimensional structure model with an existing three-dimensional model of the mechanical system to produce a refined model having intensity and/or color information from the two-dimensional image sequence and structural accuracy of the existing three-dimensional model.

In a further non-limiting embodiment, the processor system is in communication with a storage containing the two-dimensional image sequence and the existing three-dimensional model.

In a further non-limiting embodiment, the camera is a borescope.

In a further non-limiting embodiment, the two-dimensional image sequence is an image sequence of a turbine.

In a further non-limiting embodiment, the two-dimensional image sequence is an image sequence of a gas turbine engine.

In a further non-limiting embodiment, the processor system is configured to refine by matching the three-dimensional structure model with the existing three-dimensional model.

In a further non-limiting embodiment, the processor system is configured to refine by regression between the three-dimensional structure model and the existing three-dimensional model.

In a further non-limiting embodiment, the existing three-dimensional model comprises at least one of an as-designed CAD model, an as-built model, and a previous condition model.

In a further non-limiting embodiment, the processor system is configured to map the two-dimensional image sequence to the existing three-dimensional model to obtain an augmented existing three-dimensional model, and to refine the three-dimensional structure model with the augmented existing three-dimensional model.

The details of one or more embodiments of the disclosure are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

The invention relates to a system and method whereby improved inspection of a mechanical system is provided by combining a three-dimensional structure model generated from the two-dimensional sequence of images with an existing three-dimensional model to produce a refined three-dimensional image wherein the issues of parallax effect and drifting can be minimized.

Figure 1:
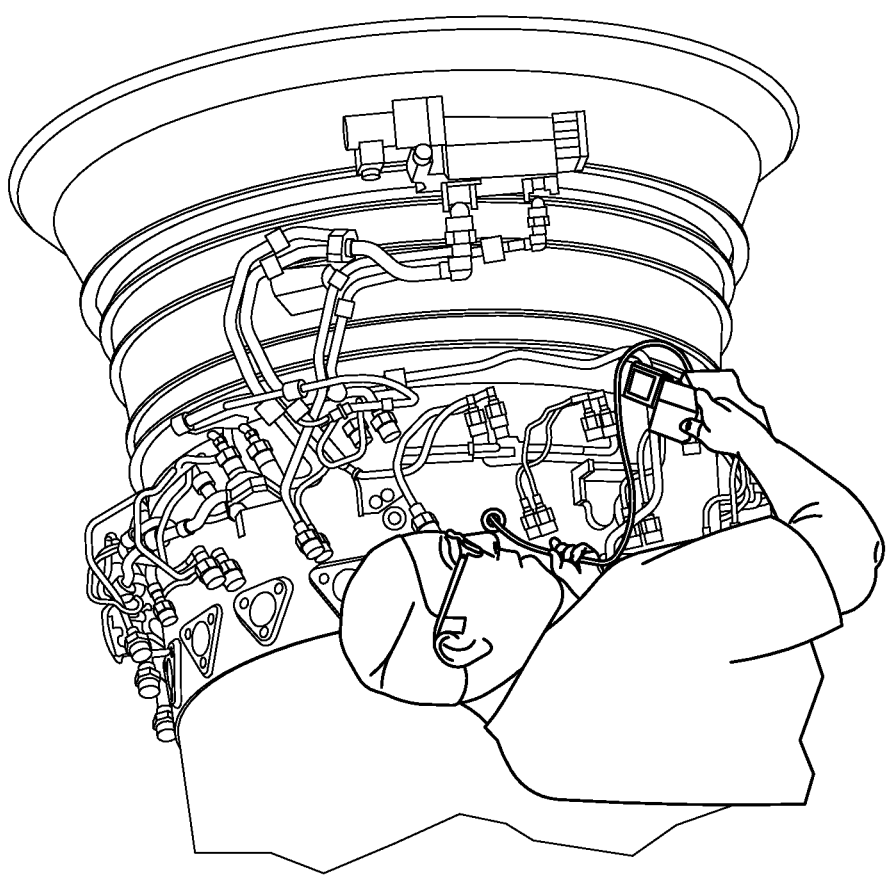
FIG. 1 illustrates a typical manual inspection of a mechanical system using a borescope.

FIG. 1 shows a typical manual inspection of a mechanical system, in this case a gas turbine engine, using a borescope which is visually monitored by the user to interpret results. Camera systems such as a borescope can store images obtained. These stored images can be processed, for example using Structure from Motion (SFM) and/or Simultaneous Localization and Mapping (SLAM) techniques, to generate a three-dimensional structure model.

In many instances, there will be available an existing three-dimensional model, for example an as-designed CAD model, an as-built model, and/or a previous condition model (as might result from the system and method disclosed herein). These existing models do not have the same issues of parallax effect or drifting and are therefore structurally more accurate than the SFM or SLAM generated three-dimensional structure model. By refining the generated three-dimensional structure model with the existing three-dimensional model, a refined model can be produced, for example having the intensity, color and/or detail of the two-dimensional sequence of images and having the structural accuracy of the existing three-dimensional model.

According to the disclosed method, an existing three-dimensional model (an as-designed CAD model, an as-built model, a previous condition model, etc.) of a component interior (high pressure turbine chamber, combustor chamber, etc.) can be used to assist the mosaicking of multiple images. As a result, the existing three-dimensional model is augmented with image details such as pixel intensity/color on its vertices and surfaces. Potential damage, with accurate metrology, can then be viewed and detected using the augmented three-dimensional model. A "fly-through" of the 3D model is also possible to get a global view of the entire structure interior. Inspection of a local area and detection of potential damage can then be performed with a clear understanding of location with respect to the global 3D model of the entire structure interior, accurate metrology, and, optionally, with a clear understanding of damage progression.

Figure 2:
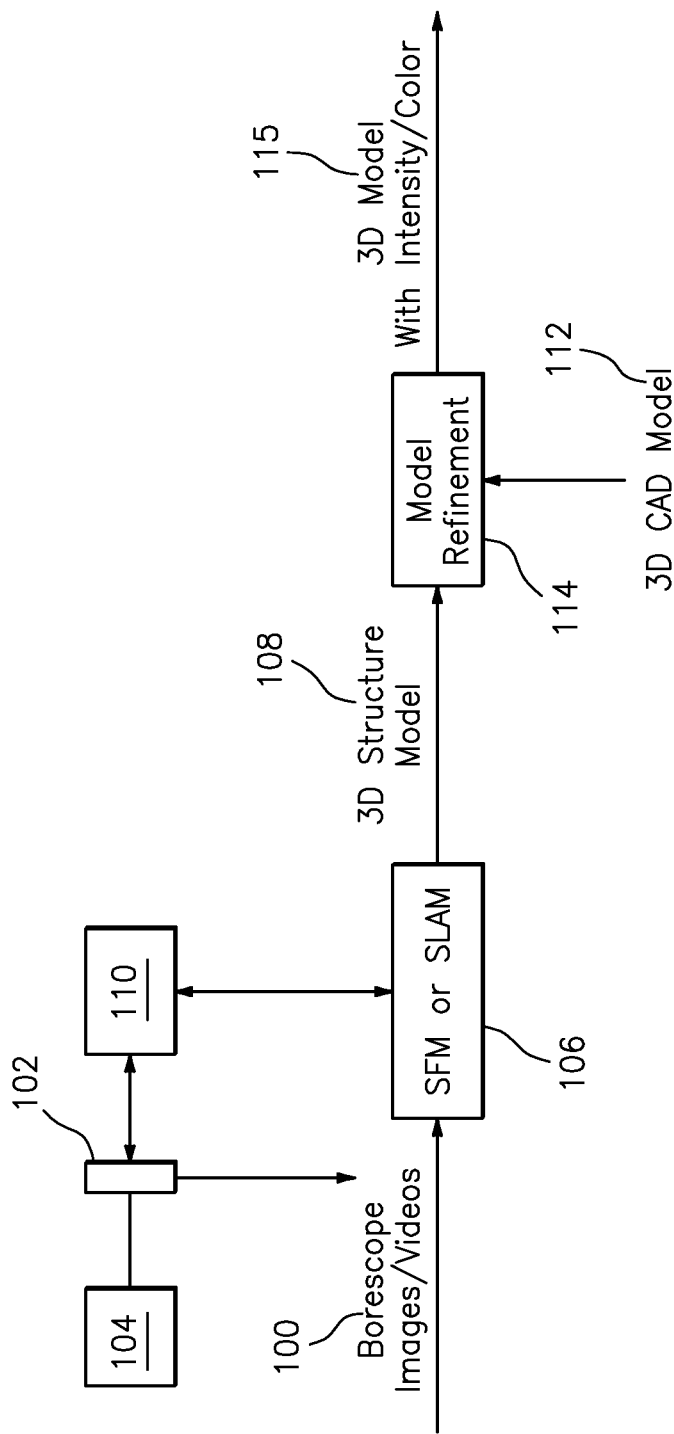
FIG. 2 schematically illustrates one exemplary embodiment of a system and method according to the disclosure.
Figure 3:
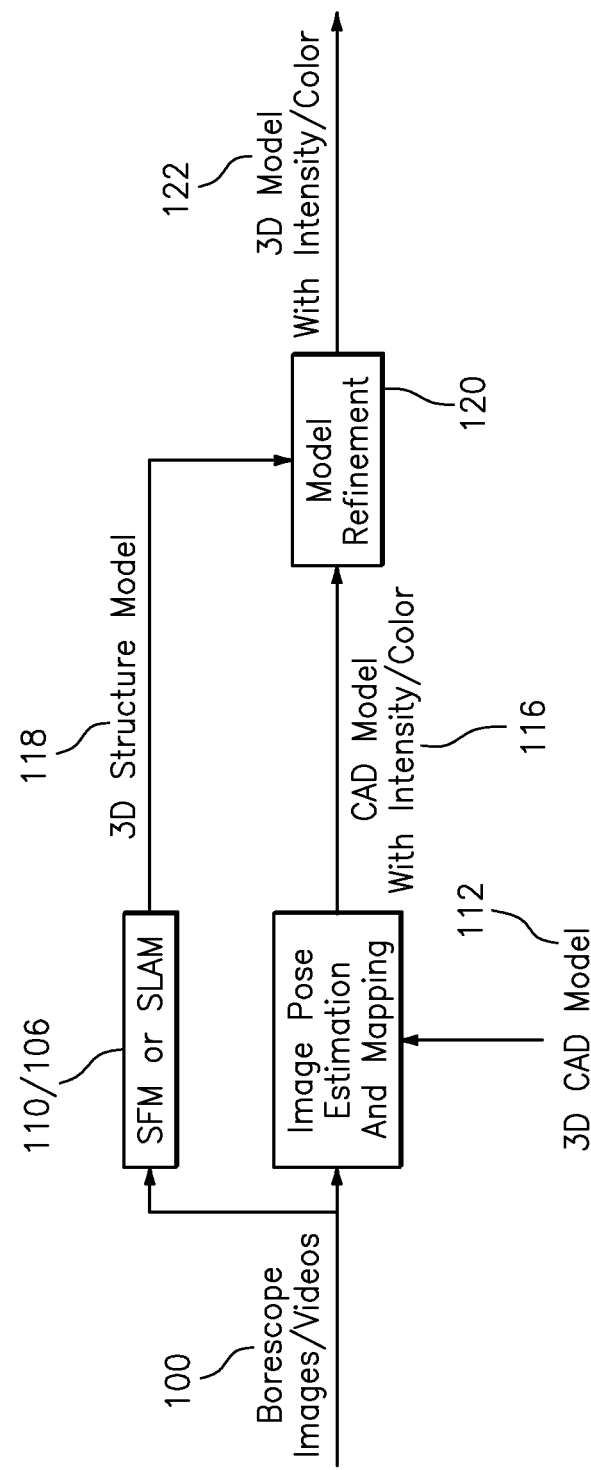
FIG. 3 schematically illustrates another exemplary embodiment of a system and method according to the disclosure.

FIGS. 2 and 3 show two different non-limiting examples of methods to leverage existing three-dimensional models in damage detection.

In FIG. 2, a sequence of images or videos is obtained, such as labeled borescope images/videos 100 (FIG. 2). These images can be obtained using a borescope 102, and the images can be stored in a storage 104, and/or transmitted to a processing system 110 which can be configured to perform the SFM and/or SLAM techniques 106 in order to generate a three-dimensional structure model 108.

Next, the accuracy of the three-dimensional structure model 108 is improved using an existing three-dimensional model such as a three-dimensional CAD model 112. Accuracy of the three-dimensional structure model 108 is improved through a model refinement step 114. Refinement step 114 can be configured to run on processing system 110, and generates a refined model 115 having, for example, intensity and/or color information from the two-dimensional image sequence and structural accuracy from the existing three-dimensional model.

The refining step can be an interpolation or averaging of features from the three-dimensional structure model 108 and the existing three-dimensional model 112.

Another example of this model refinement method carried out in the refining step can be regression between the two models to estimate a transformation from the first model to the second using vertex position information alone. The refined model obtains corresponding intensity and/or color information from the SFM-/SLAM-generated 3D structure model. The regression may be linear or non-linear (e.g., optical flow).

In one embodiment, the transformation can be formulated as a 4×4 matrix containing 15 independent parameters when vertices of the two models are represented in homogeneous coordinates. These parameters define relative translation, rotation, stretching, squeezing, and shearing between the two models. A minimum of 5 pairs of 3D vertices are identified to be corresponding to each other from the two models. The identification can be either manual, semi-automatic, or fully automatic. The coordinates of these pairs of vertices can be used first to solve a linear regression problem to get an initial estimate of the 15 parameters. This initial estimate can then be used as starting point to solve a non-linear regression problem using an algorithm such as Gauss-Newton or Levenberg-Marquardt. As a result, the refined values of the 15 parameters can be used to transform one model to match closely with the other.

FIG. 3 shows another non-limiting embodiment of the system and method. In this embodiment, the input images/video 100 can be registered with the existing three-dimensional model 112 to produce an augmented three-dimensional model 116 which is augmented with intensity and/or color from the images/videos 100. This registration can include finding corresponding fiducial marks, computing a homography, and the like. In addition, the images/videos can be processed with the processing system 110 to generate a three-dimensional structure model 118 as shown in FIG. 3. Model refinement 120 can then be carried out on the three-dimensional structure model 118 and the augmented three-dimensional model 116.

When the two three-dimensional models are combined and refined, a refined three-dimensional model results, shown at 122, and this model combines the color and intensity of the image sequence obtained with the borescope with the structural accuracy of the existing three-dimensional model.

Figure 4:
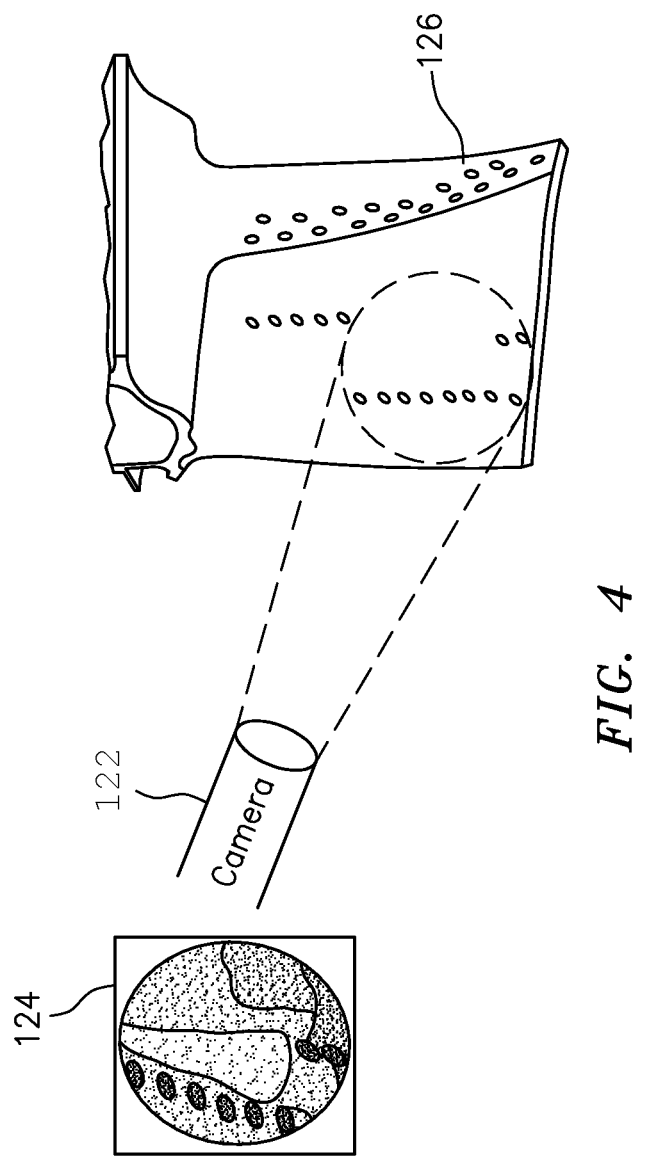
FIG. 4 illustrates an exemplary embodiment wherein the images obtained are thermal images.

It should be noted that the images or sequence of images or video can be images of various different type. One non-limiting example of an alternative type of image is a thermal intensity (or equivalently, temperature) image obtained from a hot high-pressure turbine blade is shown in FIG. 4. In FIG. 4, a camera 122 is schematically illustrated along with a thermal image 124 obtained with camera 122, and this image 124 can be obtained by camera 122 from a mechanical system such as a blade 126 as shown in this non-limiting example.

Figure 5:
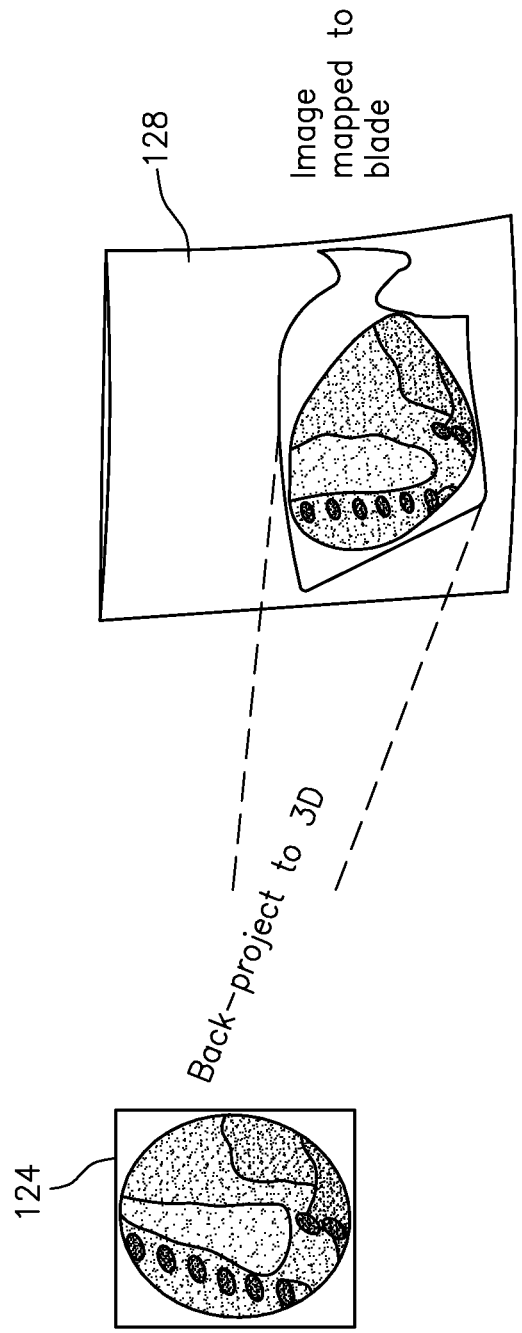
FIG. 5 illustrates mapping of a thermal image such as that obtained in FIG. 4 onto an existing three-dimensional model of a blade.

The temperature or thermal image 124 obtained in this manner can be transformed (mapped) to the surface of the existing three-dimensional model 128 as shown in FIG. 5. The mapping of the two-dimensional temperature image to the three-dimensional model may be performed, in one embodiment, by deriving a transformation that transforms the three-dimensional model vertices to two-dimensional pixel coordinates. The transformation can be formulated as a 3×4 matrix containing 11 independent parameters when two-dimensional image pixels and three-dimensional model vertices are represented in homogeneous coordinates. These parameters define relative translation, rotation, stretching, squeezing, shearing, and a three-dimensional-to-two-dimensional projection. A minimum of 6 pairs of three-dimensional vertices and two-dimensional pixel coordinates are identified to be corresponding to each other from the image and the three-dimensional model. The identification can be either manual, semi-automatic, or fully automatic. The coordinates of these pixels and vertices can be used first to solve a linear regression problem to get an initial estimate of the 11 parameters. This initial estimate can then be used as starting point to solve a non-linear regression problem using an algorithm such as Gauss-Newton or Levenberg-Marquardt. As a result, the refined values of the 11 parameters can be used to transform the three-dimensional model to match closely with two-dimensional pixels. The three-dimensional model vertices can obtain temperature values from those of their projected coordinates. This mapping uses forward projection, by projecting three-dimensional model vertices to two-dimensional temperature image coordinates.

The mapping of the two-dimensional temperature image to the three-dimensional model may be performed, in another embodiment, using backward projection. First the three-dimensional vertices are triangulated to form three-dimensional planar triangular surfaces. Then camera center coordinates are calculated from the transformation matrix. Next every image pixel is back-projected though finding an intersection between the line connecting the pixel and the camera center with a three-dimensional planar triangular surface patch. In this way, not only the three-dimensional model vertices obtain temperature values, but also the triangular surface patches, increasing the resolution of the three-dimensional model in terms of temperature mapping.

The mapping of the two-dimensional temperature image to the three-dimensional model may be performed, in yet another embodiment, by combining the above two methods.

In yet another non-limiting embodiment, if the image/video sensor location and pose are known, for example when exact location and pose of the camera or borescope are known, the images or video frames may be mapped directly to the existing three-dimensional model with local interpolation.

Once a refined three-dimensional model is obtained, either through the process of FIG. 2 or FIG. 3 or alternatives, the refined three-dimensional model can be used for either manual or automated detection of needed maintenance or repair, either immediately in the event of an issue needing immediate attention, or further maintenance can be scheduled at some time in the future if more appropriate.

One or more embodiments of the present invention have been described. Nevertheless, it will be understood that various modifications may be made without departing from the spirit and scope of the invention. For example, different sources of images and/or types of images can be utilized. Accordingly, other embodiments are within the scope of the following claims.

What is claimed is:

1. A method for inspection of a gas turbine engine mechanical system, comprising the steps of:
   obtaining a two-dimensional image sequence of internal surfaces of the gas turbine engine mechanical system;
   generating a three-dimensional structure model from the two-dimensional image sequence using a technique selected from the group consisting of Structure from Motion (SFM), Simultaneous Localization and Mapping (SLAM), and combinations thereof;
   refining the three-dimensional structure model with an existing three-dimensional model of the gas turbine engine mechanical system to produce a refined model having intensity and/or color information from the two-dimensional image sequence and structural accuracy of the existing three-dimensional model.

2. The method of claim 1, wherein the two-dimensional image sequence is obtained with a borescope.

3. The method of claim 1, wherein the refining step comprises matching the three-dimensional structure model with the existing three-dimensional model.

4. The method of claim 1, wherein the refining step comprises regression between the three-dimensional structure model and the existing three-dimensional model.

5. The method of claim 1, wherein the existing three-dimensional model comprises at least one of an as-designed CAD model, an as-built model, and a previous condition model.

6. The method of claim 1, further comprising, before the refining step, mapping the two-dimensional image sequence to the existing three-dimensional model to obtain an augmented existing three-dimensional model, and wherein the refining step comprises refining the three-dimensional structure model with the augmented existing three-dimensional model.

7. A system for inspection of a gas turbine engine mechanical system, comprising:
   a camera positionable through the gas turbine engine mechanical system to obtain a two-dimensional image sequence of internal surfaces of the gas turbine engine mechanical system;
   a processor system in communication with the camera to receive the two-dimensional image sequence and configured to generate a three-dimensional structure model from the two-dimensional image sequence by running a technique selected from the group consisting of Structure from Motion (SFM), Simultaneous Localization and Mapping (SLAM), and combinations thereof, and configured to refine the three-dimensional structure model with an existing three-dimensional model of the gas turbine engine mechanical system to produce a refined model having intensity and/or color information from the two-dimensional image sequence and structural accuracy of the existing three-dimensional model.

8. The system of claim 7, wherein the processor system is in communication with a storage containing the two-dimensional image sequence and the existing three-dimensional model.

9. The system of claim 7, wherein the camera is a borescope.

10. The system of claim 7, wherein the processor system is configured to refine by matching the three-dimensional structure model with the existing three-dimensional model.

11. The system of claim 7, wherein the processor system is configured to refine by regression between the three-dimensional structure model and the existing three-dimensional model.

12. The system of claim 7, wherein the existing three-dimensional model comprises at least one of an as-designed CAD model, an as-built model, and a previous condition model.

13. The system of claim 7, wherein the processor system is configured to map the two-dimensional image sequence to the existing three-dimensional model to obtain an augmented existing three-dimensional model, and to refine the three-dimensional structure model with the augmented existing three-dimensional model.

* * * * *